United States Patent
Aoki et al.

(10) Patent No.: US 7,521,171 B2
(45) Date of Patent: Apr. 21, 2009

(54) POSITIVE PHOTOSENSITIVE RESIN, PROCESS FOR PRODUCTION THEREOF, AND RESIST COMPOSITION CONTAINING POSITIVE PHOTOSENSITIVE RESIN

(75) Inventors: Hijiri Aoki, Ichihara (JP); Takahito Mita, Ichihara (JP)

(73) Assignee: Maruzen Petrochemical Co., Ltd. (JP)

( * ) Notice: Subject to any disclaimer, the term of this patent is extended or adjusted under 35 U.S.C. 154(b) by 259 days.

(21) Appl. No.: 11/369,431

(22) Filed: Mar. 7, 2006

(65) Prior Publication Data

US 2006/0204888 A1    Sep. 14, 2006

(30) Foreign Application Priority Data

Mar. 10, 2005    (JP) .............................. 2005-067108

(51) Int. Cl.
*G03F 7/039* (2006.01)
*C08F 2/38* (2006.01)

(52) U.S. Cl. .................... 430/270.1; 430/326; 526/222; 526/319

(58) Field of Classification Search ............ 430/270.1, 430/281.1, 285.1, 286.1, 326, 629; 522/162, 522/163, 164, 165, 166, 154; 526/222, 319
See application file for complete search history.

(56) References Cited

U.S. PATENT DOCUMENTS

| | | | | |
|---|---|---|---|---|
| 3,960,824 A | * | 6/1976 | Hicks | .......................... 526/85 |
| 5,876,899 A | * | 3/1999 | Szmanda et al. | ......... 430/270.1 |
| 6,458,752 B1 | * | 10/2002 | Rodrigues | .................... 510/230 |
| 6,610,465 B2 | * | 8/2003 | Rahman et al. | ............. 430/327 |
| 2002/0051938 A1 | * | 5/2002 | Trefonas et al. | .......... 430/270.1 |
| 2006/0094636 A1 | * | 5/2006 | Rodrigues | .................... 510/476 |

FOREIGN PATENT DOCUMENTS

| JP | 2000-214587 | 8/2000 |
|---|---|---|
| JP | 2001-098034 | 4/2001 |
| JP | 2001-106737 | 4/2001 |

\* cited by examiner

*Primary Examiner*—Cynthia H Kelly
*Assistant Examiner*—Anca Eoff
(74) *Attorney, Agent, or Firm*—Melvin I. Stoltz

(57) ABSTRACT

The positive photosensitive resin of the present invention has an acid-labile protecting group and the structure represented by the following general formula (1):

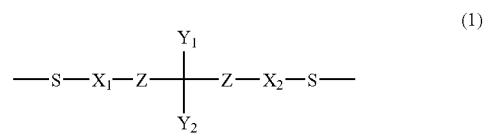

(wherein $X_1$ and $X_2$ may be the sake or different and each independently a straight or branched chain hydrocarbon group, having 1 to 30 carbon atoms, an alicyclic hydrocarbon group or a heterocyclic group, which may substituted with straight or branched chain hydrocarbon of 1 to 6 carbon atoms or —O— hydrocarbon; $Y_1$ and $Y_2$ may be the same or different and are each independently a hydrogen atom, a straight or branched chain hydrocarbon group having 1 to 6 carbon atoms, a sulfur-containing hydrocarbon group, or an aromatic hydrocarbon group which may have a substituent; and two Zs may be the same or different and each independently an oxygen atom or a sulfur atom).

6 Claims, No Drawings

POSITIVE PHOTOSENSITIVE RESIN, PROCESS FOR PRODUCTION THEREOF, AND RESIST COMPOSITION CONTAINING POSITIVE PHOTOSENSITIVE RESIN

FIELD OF THE INVENTION

The present invention relates to a positive photosensitive resin and a resist composition containing the positive photosensitive resin, both preferably used in semiconductor lithography.

BACKGROUND ART

In the lithography employed for semiconductor production, formation of a finer pattern is necessary with an increase in integration. In the formation of a fine pattern, a light source of short wavelength is essential. Currently, a lithography using a KrF excimer laser as the light source is becoming the main stream of the semiconductor lithography, and a lithography using an ArF excimer laser is being put into practical use. Further, lithographies using various radiations of short wavelength, such as $F_2$ excimer laser, EUV, X-ray, electron beam and the like are being developed.

With respect to the photoresists used in the semiconductor lithography, the chemical amplification type resist developed by Ito et al. of IBM is essential currently. In this chemical amplification type, its acid-labile protecting group can give rise to an acid catalyst-induced deprotection reaction, whereby the resist can have high sensitivity.

As specific examples of the resist polymer containing such an acid-labile protecting group, there are known, in the KrF lithography, a copolymer containing a recurring unit derived from hydroxystyrene and a recurring unit derived from an acid-labile alkoxystyrene, a copolymer containing a recurring unit derived from hydroxystyrene and a recurring unit derived from an acid-labile alkyl(meth)acrylate, and a polymer wherein part of the recurring unit derived from hydroxystyrene has been protected with acetal; and in the ArF lithography, a copolymer containing a recurring unit derived from a lactone structure-containing (meth)acrylate and a recurring unit derived from an acid-labile alkyl(meth)acrylate.

All of these copolymers are chemical amplification type resists having an acid-labile protecting group which is eliminated by an acid. In a situation that an even finer resist pattern is required, it has become difficult to obtain sufficient resist properties with such a protecting group alone.

Hence, there have been investigated resist resins wherein a copolymer containing a recurring unit having an acid-labile protecting group has an acid-labile, crosslinked portion introduced into its side chain (see, for example, Patent Literatures 1 to 3 shown later).

In these resist resins, the crosslink is severed by an acid catalyst and thereby the dissolution contrast between light-irradiated area and the light-non-irradiated area is heightened. In production of the above resist resin, a bi-functional monomer such as diacrylate or the like is used and a crosslinking reaction also takes place at the side chain of the high-molecular main chain formed; therefore, there have been the following problems. That is, the resulting polymer has an extremely large distribution of molecular weight and resultantly is low in solubility; moreover, a polymer of ultra-high molecular weight tends to be formed, accordingly, there remains, even after decomposition by an acid, a high-molecular component sparingly soluble in an alkaline developing solution, and this remaining high-molecular component produces defects in formation of fine pattern.

Also in the case (i.e. Patent Literature 1) of using, as a resist, a crosslinked polymer having, in the high-molecular side chain, a crosslinked portion having an acid-labile acetal skeleton, there have been a tendency of poor storage stability owing to the very high sensitivity to acid and further the above-mentioned tendency of low solubility and remaining (undissolved) high-molecular component.

Patent Literature 1: JP-A-2001-98034
Patent Literature 2: JP-A-2000-214587
Patent Literature 3: JP-A-2001-106737

SUMMARY OF THE INVENTION

The present invention has been made in view of the above background and aims at providing a positive photosensitive resin and a resist composition containing the positive photosensitive resin, both of which are used for fine pattern formation in semiconductor production and are preferably used in a semiconductor lithography of higher-than-before sensitivity.

To solve the problems of the prior art, the invention of claim 1 provides a positive photosensitive resin having an acid-labile protecting group which is dissociatable by the action of an acid to allow the resin to have higher solubility in an alkaline developing solution, which resin having, in the high-molecular main chain, a structure represented by the following general formula (1):

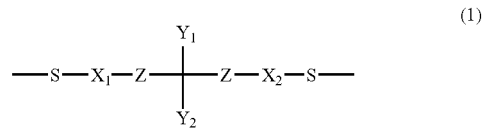

(wherein $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon; $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydrocarbon group which may have a substituent; and two Zs may be the same or different and are each independently an oxygen atom or a sulfur atom).

The invention of claim 2 provides a positive photosensitive resin according to Claim 1, which is a copolymer containing at least a recurring unit having a phenolic hydroxyl group.

The invention of claim 3 provides a positive photosensitive resin according to Claim 1 or 2, which contains at least a recurring unit wherein a phenolic hydroxyl group has been changed into an acetal form.

The invention of claim 4 provides a positive photosensitive resin according to any of Claims 1 to 3, which contains at least a (meth)acrylate derivative of alicyclic skeleton as a recurring unit.

The invention of claim 5 provides a positive photosensitive resin according to any of Claims 1 to 4, which contains at least a (meth)acrylate derivative of lactone skeleton as a recurring unit.

The invention of claim 2 provides a process for producing a positive photosensitive resin set forth in any of Claims 1 to 5, which comprises polymerizing a raw material monomer in the presence of a dithiol compound represented by the following general formula (2):

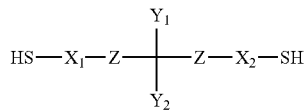
(2)

(wherein $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon; $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydrocarbon group which may have a substituent; and two Zs may be the same or different and are each independently an oxygen atom or a sulfur atom).

The invention of claim 7 provides a resist composition comprising at least a resin set forth in any of Claims 1 to 5 and at least a photo acid generator.

There has been no attempt of introducing an acid-labile structure into the high-molecular main chain of a photosensitive resin. By introducing an acid-labile structure into the main chain, there can be obtained a positive photosensitive resin of the present invention which does not generate any ultra-high molecular weight component and is narrow in molecular weight distribution. Further, by using the positive photosensitive resin of the present invention in semiconductor lithography, there can be obtained a positive photoresist composition which is small in defects caused by insoluble component and is greatly improved in sensitivity.

DETAILED DESCRIPTION OF THE INVENTION

The present invention is described in detail below.

The positive photosensitive resin of the present invention is represented by the above-shown general formula (1). In the general formula (1), $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon.

As specific examples of $X_1$ and $X_2$, the following structures can be mentioned; however, $X_1$ and $X_2$ are not restricted thereto.

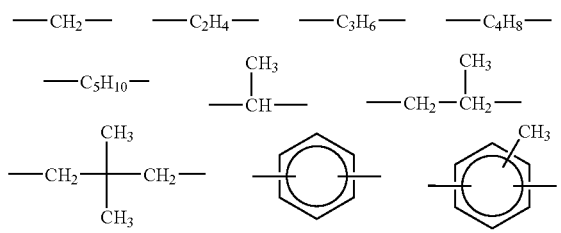

-continued

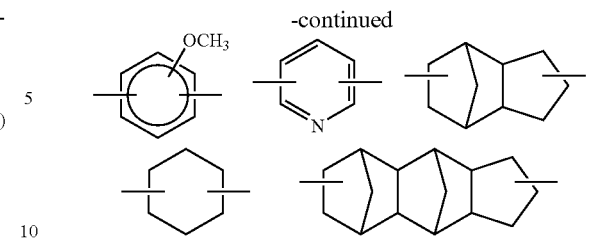

In the general formula (1), $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydrocarbon group which may have a substituent.

As specific examples of $Y_1$ and $Y_2$ in the general formula (1), the following structures can be mentioned; however, $Y_1$ and $Y_2$ are not restricted thereto.

Hydrogen atom, methyl group, ethyl group, n-propyl group, isopropyl group, n-butyl group, isobutyl group, tert-butyl group, phenol group, mercaptomethyl group, dimercaptoethyl group In the general formula (1), each Z is an oxygen atom or a sulfur atom.

In the positive photosensitive resin of the present invention, when the content of the structure represented by the general formula (1), contained in the high-molecular main chain is too small, the improvement in resist sensitivity is insufficient. Therefore, the content of the structure represented by the general formula (1) is preferably at least 0.1 mol %, more preferably at least 0.5 mol % relative to the total of the monomer units contained in the resin.

In order for the content of the structure represented by the general formula (1), to fall in the above range, the amount of the dithiol compound represented by the above-shown general formula (2), used in production (described later) of the positive photosensitive resin of the present invention is set preferably at least at 0.1 mol, more preferably at least at 0.5 mol relative to 100 mols of the raw material monomer used. Incidentally, a larger use amount of the dithiol compound results in a larger amount of the above structure in the resin but a smaller molecular weight of the copolymer obtained; therefore, the use amount of the dithiol compound is selected in a range where an intended average molecular weight is obtained for the copolymer.

When the positive photosensitive resin of the present invention has too large a weight-average molecular weight, the resin is low in solubility in the solvent used in formation of a coating film, or in the alkaline developing solution used. Meanwhile, when the resin has too small a weight-average molecular weight, the coating film formed is inferior in properties. Therefore, the weight-average molecular weight of the positive photosensitive resin of the present invention is preferably 1,000 to 200,000, more preferably 3,000 to 30,000.

As to the raw material monomer used in production of the positive photosensitive resin of the present invention, there is no particular restriction as long as the monomer is a polymerizable compound (monomer) having ethylenic double bond. However, the resin is constituted so as to contain, as essential components, at least (A) a recurring unit having a structure which, by being dissociated by an acid, has an increased solubility in alkaline developing solution and (B) a recurring unit having a polar group for higher adhesivity to substrate and, as necessary, (C) a recurring unit having a non-polar structure for controlling the solubility in resist solvent and alkaline developing solution.

The recurring unit (A) having a structure which, by being dissociated by an acid, has an increased solubility in alkaline developing solution, is a structure which has been used generally as a resist. It can be obtained by polymerizing a monomer having a structure which, by being dissociated by an acid, has an increased solubility in alkaline developing solution, or by polymerizing a monomer having an alkali-soluble structure and then protecting the alkali-soluble group with an acid-labile group.

As the monomer having a structure which, by being dissociated by an acid, has an increased solubility in alkaline developing solution, there can be mentioned compounds wherein an alkali-soluble group has been protected with an acid-labile group. They are, for example, compounds having a phenolic hydroxyl group, a carboxyl group, or a hydroxyfluoroalkyl group protected with an acid-labile group.

Therefore, as specific examples of the polymerizable compound having an alkali-soluble group, there can be mentioned hydroxystyrenes such as p-hydroxystyrene, m-hydroxystyrene, p-hydroxy-α-methylstyrene and the like; carboxylic acids having ethylenic double bond, such as acrylic acid, methacrylic acid, trifluoromethylacrylic acid, 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate and the like; and polymerizable compounds having hydroxyfluoroalkyl group, such as p-(2-hydroxy-1,1,1,3,3,3-hexafluoro-2-propyl)styrene, 2-(4-(2-hydroxy-1,1,1,3,3,3-hexafluoro-2-propyl)cyclohexyl)-1,1,1,3,3,3-hexafluoropropyl acrylate, 2-(4-(2-hydroxy-1,1,1,3,3,3-hexafluoro-2-propyl)cyclohexyl)-1,1,1,3,3,3-hexafluoropropyltrifluoromethyl acrylate, 5-(2-hydroxy-1,1,1,3,3,3-hexafluoro-2-propyl)methyl-2-norbornene and the like.

As the acid-labile protecting group, there can be mentioned, for example, saturated hydrocarbon groups such as tert-butyl group, tert-amyl group, 1-methyl-1-cyclcopentyl group, 1-ethyl-1-cyclopentyl group, 1-methyl-1-cyclohexyl group, 1-ethyl-1-cyclohexyl group, 2-methyl-2-adamantyl group, 2-ethyl-2-adamantyl group, 2-propyl-2-adamantyl group, 2-(1-adamantyl)-2-propyl group, 8-methyl-8-tricyclo[5.2.1.0$^{2,6}$]decanyl group, 8-ethyl-8-tricyclo[5.2.1.0$^{2,6}$]decanyl group, 8-methyl-8-tetracyclo[4.4.0.1$^{2,5}$.1$^{7,10}$]dodecanyl group, 8-ethyl-8-tetracyclo[4.4.0.1$^{2,5}$.1$^{7,10}$]dodecanyl group and the like; and oxygen-containing hydrocarbon groups such as 1-methoxyethyl group, 2-ethoxyethyl group, 1-isopropoxyethyl group, 1-n-butoxyethyl group, 1-tert-butoxyethyl group, 1-cyclopentyloxyethyl group, 1-cyclohexyloxyethyl group, 1-tricyclo[5.2.1.0$^{2,6}$]decanyloxyethyl group, 1-methoxymethyl group, 2-ethoxymethyl group, 1-isopropoxymethyl group, 1-n-butoxymethyl group, 1-tert-butoxymethyl group, 1-cyclopentyloxymethyl group, 1-cyclohexyloxymethyl group, 1-tricyclo[5.2.1.0$^{2,6}$]decanyloxymethyl group, tert-butoxycarbonyl group and the like.

When a monomer having an alkali-soluble structure is polymerized and then the alkali-soluble group is protected with an acid-labile protecting group, the compound having an alkali-soluble group can be used per se in the polymerization reaction and then an acid-labile protecting group can be introduced into the resulting polymer by reacting the polymer with a compound such as vinyl ether, halogenated alkyl ether or the like in the presence of an acid catalyst. As the acid catalyst used in the reaction, there can be mentioned, for example, p-toluenesulfonic acid, trifluoroacetic acid, and a strongly acidic ion exchange resin.

Meanwhile, as the monomer giving the recurring unit (B) having a polar group for higher adhesivity to substrate, there can be mentioned, for example, compounds having, as the polar group, phenolic hydroxyl group, carboxyl group or hydroxyalkyl group. As specific examples of such compounds, there can be mentioned the hydroxystyrenes and ethylenic double bond-containing carboxylic acids, mentioned above as the alkali-soluble group-containing polymerizable compound; hydroxyfluoroalkyl group-containing polymerizable compounds; monomers wherein such a compound has been substituted with polar group; and monomers wherein polar group has been bonded to an alicyclic structure such as norbornene ring, tetracyclododecene ring or the like.

As the polar group contained in the recurring unit (B), a polar group containing a lactone structure is preferred particularly. There can be mentioned, for example, polar groups containing a lactone structure such as γ-butyrolactone, γ-valerolactone, δ-valerolactone, 1,3-cyclohexanecarbolactone, 2,6-norbornanecarbolactone, 4-oxatricyclo[5.2.1.0$^{2,6}$]decan-3-one, mevalonic acid δ-lactone and the like. As the polar group other than lactone structure, there can be mentioned, for example, hydroxyalkyl groups such as hydroxymethyl group, hydroxyethyl group, hydroxypropyl group, 3-hydroxy-1-adamantyl group and the like.

As the monomer giving a recurring unit (C) having a non-polar substituent for controlling the solubility in resist solvent or alkaline developing solution, which is contained in the present resin as necessary, there can be mentioned, for example, compounds having a substituted or unsubstituted alkyl or aryl group containing no polar group, or a polar group protected with a non-polar, acid-non-dissociatable group. As specific examples of such compounds (monomers), there can be mentioned styrenes such as styrene, α-methylstyrene, p-methylstyrene and the like; ester compounds wherein an ethylenic double bond-containing carboxylic acid (e.g. acrylic acid, methacrylic acid, trifluoromethylacrylic acid, norbornenecarboxylic acid, 2-trifluoromethylnorbornenecarboxylic acid, or carboxytetracyclo[4.4.0.1$^{2,5}$.1$^{7,10}$) has been substituted with an acid-stable, non-polar group; and ethylenic double bond-containing alicyclic hydrocarbon compounds such as norbornene, tetracyclododecene and the like. As examples of the above-mentioned acid-stable, non-polar substituent used for substitution of ethylenic double bond-containing carboxylic acid for ester compound formation, there can be mentioned methyl group, ethyl group, cyclopentyl group, cyclohexyl group, isobornyl group, tricyclo[5.2.1.0$^{2,6}$]decanyl group, 2-adamantyl group and tetracyclo[4.4.0.1$^{2,5}$.1$^{7,10}$]dodecyl group.

These monomers can be used in one kind or two or more kinds for each of the recurring units (A), (B) and (C). The proportions of the three recurring units in the photosensitive resin obtained can be selected in a range wherein the basic properties of resist are not impaired. That is, in general, the proportion of the recurring unit (A) is preferably 10 to 70 mol %, more preferably 10 to 60 mol %. The proportion of the recurring unit (B) is preferably 30 to 90 mol %, more preferably 40 to 90 mol %; however, it is preferably 70 mol % or less when the recurring unit (B) is constituted by monomers having the same polar group. The proportion of the recurring unit (C) is preferably 0 to 50 mol %, more preferably 0 to 40 mol %.

The structure of the positive photosensitive resin of the present invention is as follows. Also, the mechanism of severance of the present positive photosensitive resin by acid is presumed to be as follows.

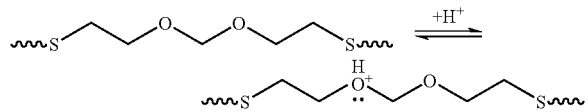

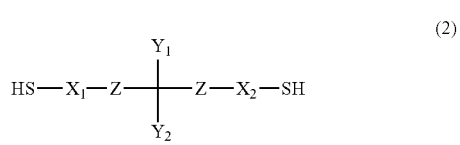

In the formula (2), $X_1$, $X_2$, $Y_1$, $Y_2$ and $Z$ are the same as the $X_1$, $X_2$, $Y_1$, $Y_2$ and $Z$ in the formula (1).

Specific examples of the dithiol compound represented by the formula (2) are shown below; however, the compound is not restricted thereto.

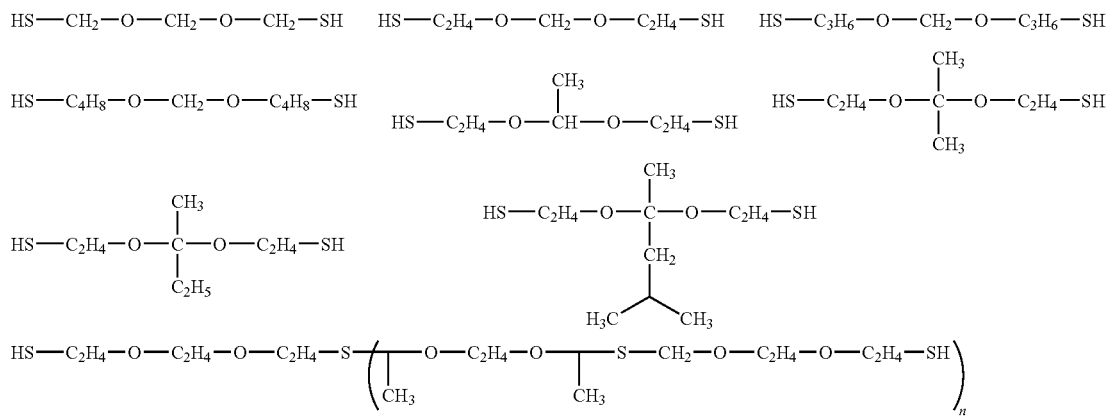

$n = 1, 2, 3, 4$

-continued

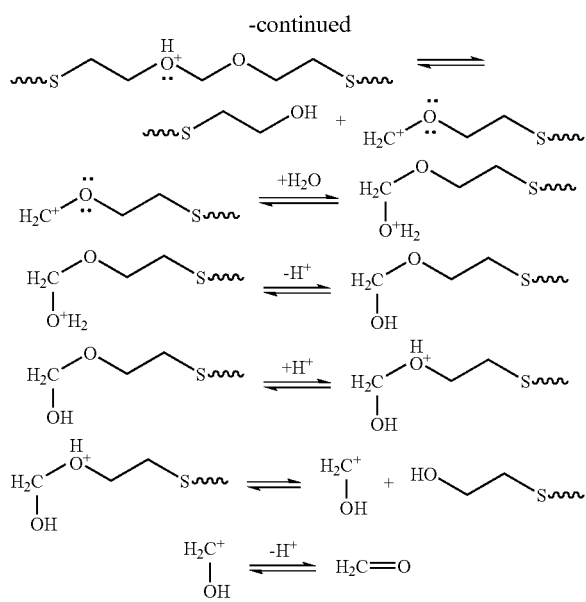

Incidentally, ⁓ indicates the polymerization site of polymerizing compound.

Next, description is made on the process for producing the positive photosensitive resin of the present invention. In producing the positive photosensitive resin of the present invention, a dithiol compound represented by the following general formula (2) is used as a chain transfer agent in radical polymerization, or as a polymerization initiator in redox polymerization.

As to the polymerization initiator used when the positive photosensitive resin of the present invention is produced by radical polymerization using the above dithiol compound as a chain transfer agent, there is no particular restriction as long as it is a compound generally used as a radical-generating agent. There can be mentioned, for example, azo compounds such as 2,2'-azobisisotyronitrile, 2,2'-azobis(2-methylbutyronitrile), dimethyl2,2'-azobisisobutyrate, 1,1'-azobis(cyclohexane-1-carbonitrile), 4,4'-azobis(4-cyanovaleric acid) and the like; and organic peroxides such as decanoyl peroxide, lauroyl peroxide, benzoyl peroxide, bis(3,5,5-trimethylhexanoyl)peroxide, succinic acid peroxide, tert-butyl peroxy-2-ethylhexanoate and the like. They can be used singly or in admixture. The use amount of the polymerization initiator differs depending upon the kinds and amounts of the raw material monomer and chain transfer agent used in the polymerization reaction and the polymerization conditions (temperature and solvent) used; therefore, it can not be specified in a given range. However, the use amount is selected generally in a range of 0.01 to 10 mols, preferably in a range of 0.1 to 5 mols relative to 1 mol of the chain transfer agent.

Meanwhile, as the polymerization accelerator used when the present positive photosensitive resin is produced by redox polymerization using the dithiol compound as a polymerization initiator, there can be used, singly or in admixture, salts or complexes of metals such as vanadium, chromium, manganese, iron, cobalt, nickel and the like. There is particularly preferred a salt or complex of vanadium having a large ionization potential gap. As the salt or complex of vanadium, there can be mentioned, for example, vanadium naphthenate, vanadyl stearate, $V(acac)_3$ and $VO(acac)_2$. The use amount of the polymerization accelerator differs depending upon the kinds and amounts of the raw material monomer and dithiol used in the polymerization reaction and the polymerization conditions (temperature and solvent) used; therefore, it can not be specified in a given range. However, the use amount is selected generally in a range of 0.0001 to 1 mol, preferably in a range of 0.0001 to 0.01 mol relative to 1 mol of the dithiol compound.

As the polymerization method used in producing the present positive photosensitive resin, solution polymerization is preferred. It is preferred to conduct polymerization in a state that the raw material monomer, etc. have been dissolved in a polymerization solvent. The solution polymerization can be carried out, for example, by so-called simultaneous polymerization wherein all of the monomer, the initiator, the chain transfer agent, etc. are dissolved in a polymerization solvent and heated to a polymerization temperature, or by so-called dropping polymerization wherein part or the whole portion of the monomer, the initiator, the chain transfer agent, etc. is dropped in a polymerization system heated to a polymerization temperature.

As to the solvent used in the polymerization reaction, there is no particular restriction as long as it can stably dissolve the raw material monomer, the copolymer obtained, the polymerization initiator and the chain transfer agent. As specific examples of the polymerization solvent, there can be mentioned ketones such as acetone, methyl ethyl ketone, methyl amyl ketone and the like; ethers such as tetrahydrofuran, dioxane, glyme, propylene glycol monomethyl ether and the like; esters such as ethyl acetate, ethyl lactate and the like; ether esters such as propylene glycol methyl ether acetate and the like; and lactones such as γ-butyrolactone and the like. These solvents can be used singly or in admixture. There is no particular restriction as to the use amount of the polymerization solvent; however, the amount is ordinarily 0.5 to 20 parts by weight, preferably 1 to 10 parts by weight relative to 1 part by weight of the monomer used. When the use amount of the solvent is too small, the monomer or the copolymer may separate out; when the use amount is too large, the rate of the polymerization reaction may be insufficient.

The conditions of polymerization reaction are not particularly restricted; however, in general, the reaction temperature is preferably about 60 to 100° C. and the reaction time is preferably about 1 to 20 hours.

The polymer obtained by the above polymerization reaction can be purified by dropping the reaction mixture into a poor solvent alone or a mixture of a poor solvent and a good solvent to separate out the polymer and, as necessary, washing the polymer to remove unnecessary materials such as unreacted monomer, oligomer, polymerization initiator, chain transfer agent, reaction products thereof and the like. There is no particular restriction as to the poor solvent used as long as the copolymer formed is insoluble therein; however, there can be used, singly or in admixture, for example, water, alcohols (e.g. methanol and isopropanol), and saturated hydrocarbons (e.g. hexane and heptane). There is no particular restriction as to the good solvent used as long as the monomer, the oligomer, the polymerization initiator, the chain transfer agent and their reaction products are soluble therein; however, the same solvent as the polymerization solvent is preferred for simpler control of the production steps.

The copolymer after purification contains the solvent used in purification. Therefore, there is used, for example, a step of subjecting the purified copolymer to vacuum drying and then dissolving the copolymer in a solvent for resist, or a step of once dissolving the purified copolymer in a solvent for resist or in a good solvent such as polymerization solvent or the like and then, while the resist solvent is being supplied as necessary, subjecting the solution to distillation under reduced pressure to remove the other solvent, whereby the purified copolymer can be made into a solution for resist.

As to the solvent for resist, there is no particular restriction as long as it can dissolve the copolymer. However, it is ordinarily selected in consideration of the boiling point, the influence on semiconductor substrate and other coating film, and the absorption of the radiation used in lithography. As examples of the solvent generally used for resist, there can be mentioned propylene glycol methyl ether acetate, ethyl lactate, methyl amyl ketone, γ-butyrolactone and cyclohexanone. The use amount of the solvent is not particularly restricted but is ordinarily 1 to 20 parts by weight per 1 part by weight of the copolymer.

When the positive photosensitive resin of the present invention is used as a resist, the above-mentioned solution for resist is mixed with (a) an agent which generates an acid when irradiated with a light and (b) an acid diffusion-controlling agent (e.g. a nitrogen-containing compound) for preventing the acid diffusion into radiation-non-applied resist portion, whereby a resist composition can be obtained. As the agent which generates an acid when irradiated with a light, there can be used those compounds generally used as a raw material for resist, such as onium salt compound, sulfone compound, sulfonic acid ester compound, sulfonimide compound, disulfonyldiazomethane compound and the like. The resist composition may further contain, as necessary, compounds generally used as additives for resist, such as dissolution-suppressing agent, sensitizer, dye and the like.

There is no particular restriction as to the compounding proportions of the individual components (excluding resist solvent) in the resist composition; however, in general, the polymer concentration is 10 to 50% by mass, the radiation-sensitive, acid-generating agent is 0.1 to 10% by mass, and the acid diffusion-controlling agent is 0.001 to 10% by mass.

EXAMPLES

Next, the present invention is described further by way of Examples. However, the present invention is in no way restricted to these Examples. Incidentally, the average copolymer composition of each copolymer obtained was determined from the measurement result of $^{13}$C-NMR, and the weight average molecular weight Mw and the polydispersity Mw/Mn were determined from the measurement result of gel permeation chromatography (GPC).

Example 1

Synthesis of poly(p-hydroxystyrene-co-tert-butyl acrylate) Having, in the Main Chain, a Portion which is Severed by an Acid

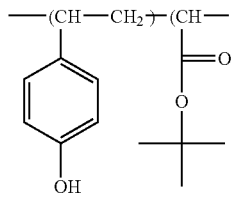 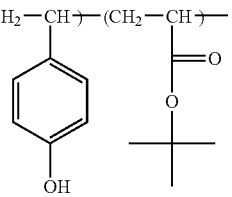

Into a 50 cc-Schlenk tube were fed 26.8 g of crude p-hydroxystyrene (obtained by dehydrogenating p-ethylphenol) {p-hydroxystyrene (hereinafter abbreviated to PHS): 23 parts by weight, p-ethylphenol: 45 parts by weight, methanol: 22 parts by weight, water: 10 parts by weight}, 3.18 g of tert-butyl acrylate (hereinafter abbreviated to TBA), 0.23 g of 3,5-dioxa-1,7-heptanedithiol (hereinafter abbreviated to DMA) and 0.62 g of dimethyl-2,2'-azobisisobutylate (hereinafter abbreviated to MAIB). The mixture was stirred at room temperature for 20 minutes to obtain a complete solution. The Schlenk tube was fitted with a cooling tube and immersed in an oil bath heated at 70° C., and the Schlenk tube contents were stirred for 6 hours and then cooled to room temperature. The resulting reaction mixture was poured into 150 g of toluene to separate out a polymer. The supernatant solution was discarded by decantation. Then, the polymer was redissolved in 10 g of acetone, 150 g of toluene was added to separate out a polymer, and the supernatant solution was discarded by decantation. This operation was repeated once more. The resulting polymer was redissolved in 10 g of acetone, a polymer was separated out with 200 g of hexane, and the supernatant solution was discarded by decantation. The resulting rice cake-like precipitate was dried at 60° C. at 10 torr (under reduced pressure) for 3 days to obtain 9 g of a light yellow polymer powder. The dithiol content, average copolymer composition, weight-average molecular weight and polydispersity of the polymer obtained are shown in Table 1.

Into a 50 cc-Schlenk tube were fed 4.45 g of 5-methacryloyloxy-2,6-norbornanecarbolactone (hereinafter abbreviated to NLM), 4.70 g of 2-methyl-2-adamantyl methacrylate (hereinafter abbreviated to MAM), 29.9 g of tetrahydrofuran, 0.14 g of DMA and 0.18 g of MAIB. The mixture was stirred at room temperature for 20 minutes to obtain a complete solution. The Schlenk tube was fitted with a cooling tube and immersed in an oil bath heated at 70° C., and the Schlenk tube contents were stirred for 6 hours and then cooled to room temperature. The resulting reaction mixture was poured into 180 g of methanol to separate out a polymer. The mixture was filtered through a filter paper of 1 micron (size of retained particles). The resulting wet cake-like polymer was poured into 180 g of methanol, washing was made with stirring, and the methanol was separated by filtration. This operation was conducted two times. The resulting polymer was dried at 60° C. at 10 torr for 3 days to obtain 6.5 g of a white polymer. The dithiol content, average copolymer composition, weight-average molecular weight and polydispersity of the polymer obtained are shown in Table 1.

Example 2

Synthesis of poly(5-methacryloyloxy-2,6-norbornanecarbolactone-co-2-methyl-2-adamantyl methacrylate) Having, in the Main Chain, a Portion which is Severed by an Acid

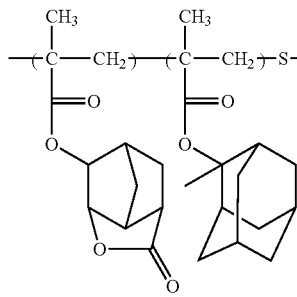 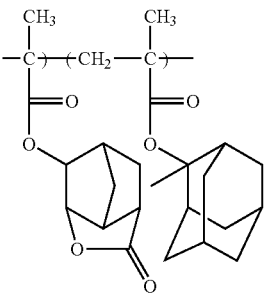

Example 3

Synthesis of poly(γ-butyrolacton-2-yl methacrylate-co-tert-butyl methacrylate) Having, in the Main Chain, a Portion which is Severed by an Acid

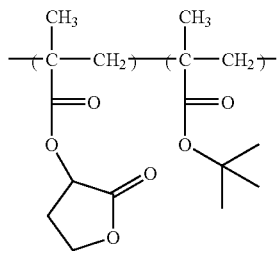

Into a 50 cc-Schlenk tube were fed 5.10 g of γ-butyrolaton-2-yl methacrylate (hereinafter abbreviated to GBM), 4.27 g of tert-butyl methacrylate (hereinafter abbreviated to TBMA), 28.2 g of tetrahydrofuran, 0.21 g of DMA and 0.28 g of MAIB. The mixture was stirred at room temperature for 20 minutes to obtain a complete solution. The Schlenk tube was fitted with a cooling tube and immersed in an oil bath heated at 70° C., and the Schlenk tube contents were stirred for 6 hours and then cooled to room temperature. The resulting reaction mixture was poured into 180 g of methanol to separate out a polymer. The mixture was filtered through a filter paper of 1 micron (size of retained particles). The resulting wet cake-like polymer was poured into 180 g of methanol, washing was made with stirring, and the methanol was separated by filtration. This operation was conducted two times. The resulting polymer was dried at 60° C. at 10 torr for 3 days to obtain 4.5 g of a white polymer. The dithiol content, average copolymer composition, weight-average molecular weight and polydispersity of the polymer obtained are shown in Table 1.

Comparative Example 1

Synthesis of poly(p-hydroxystyrene-co-tert-butyl acrylate) Having, in the Main Chain, No Portion which is Severed by an Acid

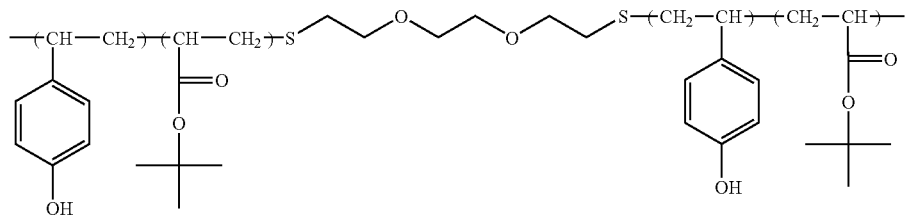

7 g of a polymer was synthesized in the same manner as in Example 1 except that the chain transfer agent was changed to 0.24 g of 3,6-dioxa-1,8-octanedithiol (DOODT). The DOODT content, average copolymer composition, weight-average molecular weight and polydispersity of the polymer obtained are shown in Table 1.

Comparative Example 2

Synthesis of poly(5-methacryloyloxy-2,6-norbornanecarbolactone-co-2-methyl-2-adamantyl methacrylate) Having, in the Main Chain, No Portion which is Severed by an Acid

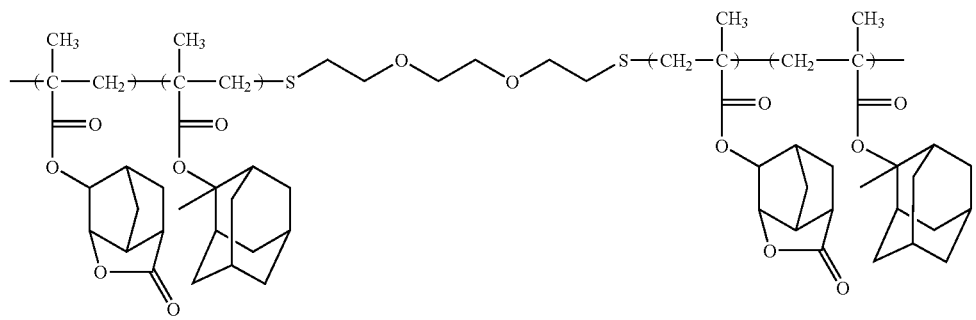

7 g of a polymer was synthesized in the same manner as in Example 2 except that the chain transfer agent was changed to 0.15 g of DOODT. The DOODT content, average copolymer composition, weight-average molecular weight and polydispersity of the polymer obtained are shown in Table 1.

Comparative Example 3

Synthesis of poly(γ-butyrolacton-2-yl methacrylate-co-tert-butyl methacrylate) Having, in the Main Chain, No Portion which is Severed by an Acid

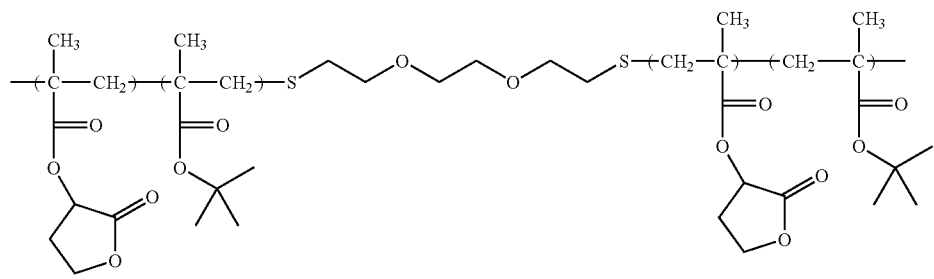

4 g of a polymer was synthesized in the same manner as in Example 3 except that the chain transfer agent was changed to 0.22 g of DOODT. The DOODT content, average copolymer composition, weight-average molecular weight and polydispersity of the polymer obtained are shown in Table 1.

romethanesulfonate were dissolved in 5.8 g of propylene glycol monomethyl ether acetate. The solution was filtered through a Teflon (registered trademark) filter of 0.2 μm to prepare a resist. Then, the resist was spin-coated on a silicon wafer of 100 mm in diameter, treated with hexamethyldisilazane, followed by baking on a hot plate at 130° C. for 60 seconds to obtain a thin resist film of 0.6 μm in thickness. The resist film-formed wafer was allowed to stand in a contact type exposure tester, and a mask obtained by drawing a pattern on a quartz plate with chromium was allowed to tightly contact with the resist film. An ultraviolet light of 248 nm was applied to the resist film through the mask. Immediately thereafter, post-baking was conducted on the hot plate at 150° C. for 60 seconds. The resulting wafer was immersed in an aqueous solution of 0.26 mol/l of TMAH, of 23° C. for 30 seconds for development, followed by rinsing with pure water

TABLE 1

| | Content of chain transfer agent (mol %) | | Average copolymer composition (mol %) | | | | | | Molecular weight | |
|---|---|---|---|---|---|---|---|---|---|---|
| | DMA | DOODT | PHS | TBA | NLM | MAM | GBM | TBMA | Mw | Mw/Mn |
| Ex. 1 | 0.8 | — | 65 | 35 | — | — | — | — | 18,000 | 2.5 |
| Comp. Ex. 1 | — | 1.2 | 65 | 35 | — | — | — | — | 20,000 | 3.0 |
| Ex. 2 | 2.0 | — | — | — | 55 | 45 | — | — | 10,000 | 1.4 |
| Comp. Ex. 2 | — | 2.0 | — | — | 54 | 46 | — | — | 11,000 | 1.4 |
| Ex. 3 | 1.8 | — | — | — | — | — | 57 | 43 | 7,500 | 1.5 |
| Comp. Ex. 3 | — | 1.3 | — | — | — | — | 59 | 41 | 7,500 | 1.5 |

Example 4

Evaluation of Resist Sensitivity

A resist composition having the following composition was prepared. 1 g of the polymer obtained in Example 1 and 0.01 g of an agent which generates an acid when irradiated with a light, i.e. 5-norbornene-2,3-dicaboxyimidyl trifluofor 60 seconds. As a result, there was obtained a positive pattern in which only the light-applied portion of the resist film had been removed by dissolution in the developing solution. Similarly, the resists prepared using the resins obtained in Examples 2 and 3 and Comparative Examples 1, 2 and 3 were evaluated. The details are shown in Table 2.

TABLE 2

| | Film thickness (μm) | Post-baking time (sec) | Alkali concentration of developing solution (mol/l) | Development time (sec) | Sensitivity (mJ/cm$^2$) |
|---|---|---|---|---|---|
| Resist containing main chain acid-severable resin of Ex. 1 | 0.6 | 60 | 0.26 | 30 | 0.9 |

TABLE 2-continued

| | Film thickness (μm) | Post-baking time (sec) | Alkali concentration of developing solution (mol/l) | Development time (sec) | Sensitivity (mJ/cm$^2$) |
|---|---|---|---|---|---|
| Resist containing resin of Comp. Ex. 1 | 0.6 | 60 | 0.26 | 30 | 3 |
| Resist containing main chain acid-severable resin of Ex. 2 | 0.5 | 120 | 0.38 | 60 | 36 |
| Resist containing resin of Comp. Ex. 2 | 0.5 | 120 | 0.38 | 60 | 140 |
| Resist containing main chain acid-severable resin of Ex. 3 | 0.5 | 120 | 0.38 | 60 | 280 |
| Resist containing resin of Comp. Ex. 3 | 0.5 | 120 | 0.38 | 60 | 350 |

As is clear from Table 2, the resists containing the main chain acid-severable resins obtained in Examples, as compared with the resists containing main chain acid-non-severable resins, are greatly improved in sensitivity.

What is claimed is:

1. A positive photosensitive resin having an acid-labile protecting group which is dissociatable by the action of an acid to allow the resin to have higher solubility in an alkaline developing solution, which resin is a copolymer containing at least a recurring unit having a phenolic hydroxyl group and has, in the high-molecular main chain, a structure represented by the following general formula (1):

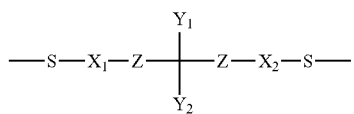

(1)

(wherein $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon; $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydro-carbon group which may have a substituent; and two Zs may be the same or different and are each independently an oxygen atom or a sulfur atom).

2. The positive photosensitive resin defined in claim 1, which is a copolymer containing at least a recurring unit whose phenolic hydroxyl group has been changed into an acetal form.

3. The positive photosensitive resin defined in claim 1, which is a copolymer containing at least a recurring unit having a (meth)acrylate derivative of alicyclic skeleton.

4. A positive photosensitive resin having an acid-labile protecting group which is dissociatable by the action of an acid to allow the resin to have higher solubility in an alkaline developing solution, which resin is a copolymer containing at least a recurring unit having a (meth) acrylate derivative of lactone skeleton and has, in the high-molecular main chain, a structure represented by the following general formula (1)

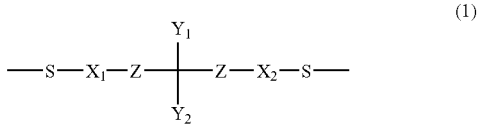

(1)

(wherein $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon; $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydro-carbon group which may have a substituent; and two Zs may be the same or different and are each independently an oxygen atom or a sulfur atom).

5. The process for producing a positive photosensitive resin defined in claim 1, which comprises polymerizing a raw material monomer in the presence of a dithiol compound represented by the following general formula (2)

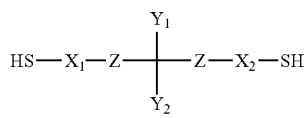

(2)

(wherein $X_1$ and $X_2$ may be the same or different and are each independently a straight chain or branched chain hydrocarbon group having 1 to 30 carbon atoms, an alicyclic hydrocarbon group, an aromatic hydrocarbon group or a heterocyclic group, and these groups may be substituted with straight chain or branched chain hydrocarbon of 1 to 6 carbon atoms or —O-hydrocarbon; $Y_1$ and $Y_2$ may be the same or different and are each independently a hydrogen atom, a straight chain or branched chain hydrocarbon group having 1 to 6 carbon atoms, a sulfur-containing hydrocarbon group, or an aromatic hydrocarbon group which may have a substituent; and two Zs may be the same or different and are each independently an oxygen atom or a sulfur atom).

6. A resist composition comprising at least a resin as defined in claim 1 and at least an agent which generates an acid when irradiated with a light.

* * * * *